United States Patent [19]

Hebert Raymond T.

[11] Patent Number: 4,855,687
[45] Date of Patent: Aug. 8, 1989

[54] TRANSIMPEDANCE AMPLIFIER WITH NOISE REDUCTION AND BANDWIDTH COMPENSATION

[75] Inventor: Hebert Raymond T., Saratoga, Calif.

[73] Assignee: Micro Video, Inc, Campbell, Calif.

[21] Appl. No.: 162,130

[22] Filed: Feb. 29, 1988

[51] Int. Cl.[4] .......................... H03F 3/191; H03F 3/08
[52] U.S. Cl. ...................................... 330/304; 330/59; 330/308
[58] Field of Search ........................ 250/214 A, 214 C; 330/59, 149, 293, 302, 303, 304, 306, 308

[56] References Cited

U.S. PATENT DOCUMENTS 4,470,020  9/1984  Mohr ..................................... 330/304

Primary Examiner—Steven Mottola
Attorney, Agent, or Firm—Paul Hentzel

[57] ABSTRACT

The signal-to-noise ratio of a transimpedance operational amplifier is enhanced by employing a large feedback resistor. Bandwidth lost in the process recaptured by a compensation network without reducing the signal-to-noise ratio. The compensation network provides a zero which cancels the upper 3 db pole of the transimpedance amplifier, and also provides a high frequency pole defining the restored bandwidth of amplifier.

31 Claims, 3 Drawing Sheets

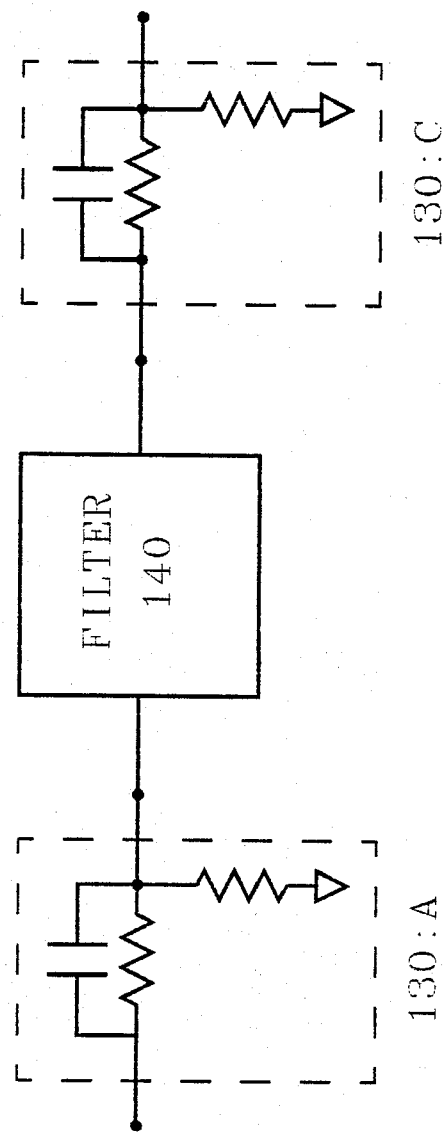

4,855,687

TRANSIMPEDANCE AMPLIFIER WITH NOISE REDUCTION AND BANDWIDTH COMPENSATION

TECHNICAL FIELD

This invention relates to signal processing in linear systems and more particularly to such systems with frequency compensation circuits.

BACKGROUND

Heretofore compensation circuits have been employed with transimpedance operational amplifiers. However the compensation has been used primarily in the feedback path of the amplifier. U.S. Pat. No. 3,927,383 to Fjarlie et al employs positive and negative feedback to improve the bandwidth without degrading noise performance. U.S. Pat. No. 4,492,931 to Deweck employs a frequency selective transadmittance feedback for low frequency noise reduction. U.S. Pat. No. 4,553,623 to Bridgewater et al shows switched feedback capacitance for gain control. U.S. Pat. No. 4,574,249 to Williams shows a voltage dependent current source connected in negative feedback with a forward voltage amplifier. U.S. Pat. No. 4,620,321 to Chown shows non-linear Schottky diode to prevent large pulse degradation of the signal. U.S. Pat. No. 4,623,786 to Rodwell shows such a feedback path containing an FET for overload prevention.

U.S. Pat. No. 4,000,397 to Hebert et al shows a preamplifier with a 3 db pole used in a subsequent filter circuit for defining the bandwidth of the system.

SUMMARY

It is therefore an object of this invention to provide an improved linear transimpedance amplifier circuit with frequency compensation.

It is another object of this invention to provide such a amplifier with improved signal to noise ratio.

It is a further object of this invention to provide a linear data processing circuit for a bar code scanner system having a transimpedance amplifier with an improved signal to noise ratio.

Briefly, these and other objects of the present invention are accomplished by providing a transimpedance device having an effective feedback impedance with an effective thermal noise level and an effective transimpedance transfer function. The transimpedance device is responsive to an input current signal for providing an output signal with an enhanced signal-to-noise ratio and an enhanced frequency bandwidth. An transimpedance operational amplifier has a feedback impedance connected in negative feedback relationship. The feedback impedance is substantially less than the effective impedance of the transimpedance device. The transimpedance transfer function of the operational amplifier is therefore substantially less than the transimpedance transfer function of the transimpedance device. The feedback impedance has a thermal noise level substantially greater than the effective noise level of the transimpedance device. The feedback impedance and the capacitance at the input of the amplifier determine the upper 3 db pole frequency $f_{pa}$ on the Bode plot of the amplifier at a frequency substantially less than the enhanced bandwidth of the transimpedance device. A frequency compensation network is responsive to the signal at the output of the operational amplifier for creating an upper 3 db pole frequency $f_{pc}$ in the Bode plot of the output signal of the transimpedance device which is substantially greater than the pole frequency $f_{pa}$ for enhancing the bandwidth and signal-to-noise ratio of the output signal of the transimpedance device.

BRIEF DESCRIPTION OF THE DRAWING

Further objects and advantages of the amplifier and the signal processing system and the operation of frequency compensation will become apparent from the following detailed description and drawing in which:

FIG. 3 is a circuit diagram of a double zero compensation circuit for use with a double pole amplifier.

Figure 1:
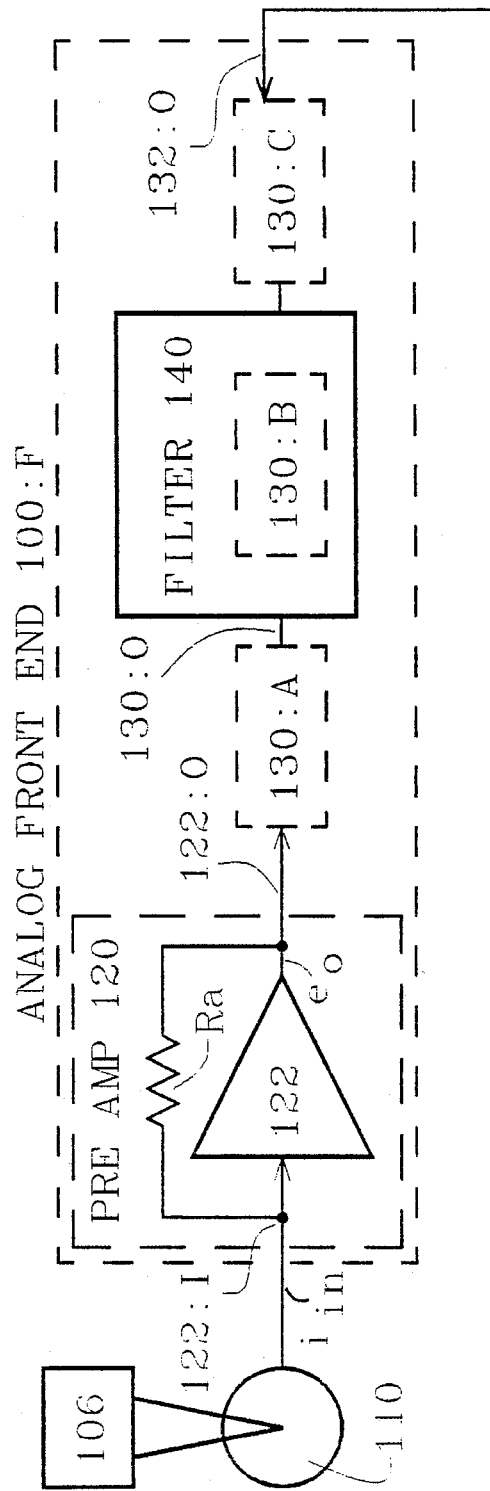
FIG. 1 is a block diagram of the signal processing system showing a linear analog front-end section with a transimpedance amplifier, and a digital back-end section.
Figure 1:
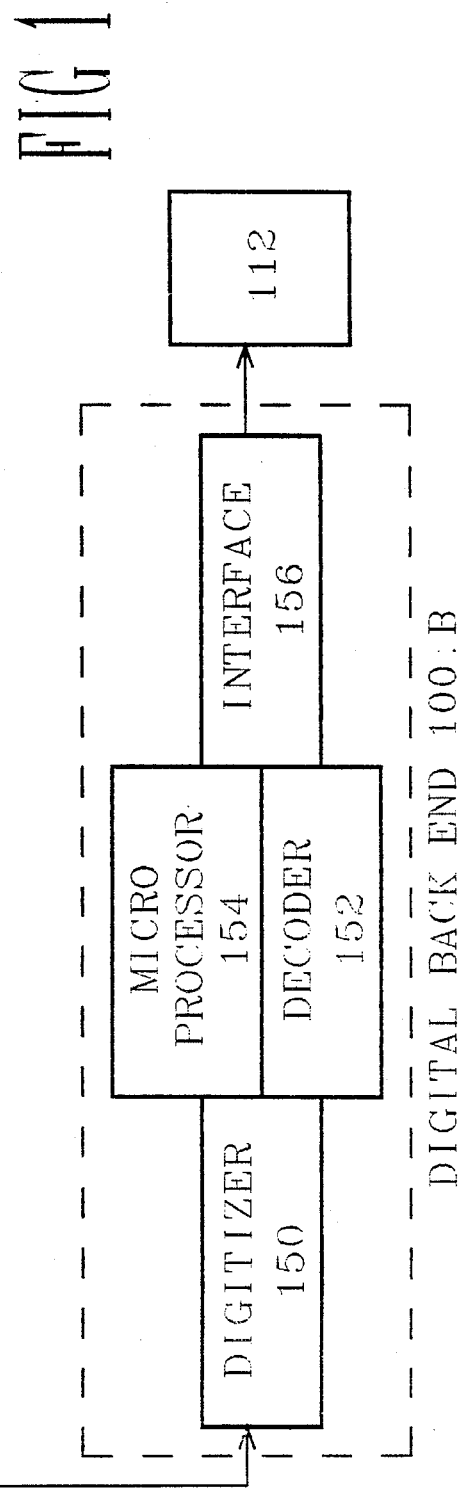

The first two digits of each reference numeral indicate a particular circuit element. The third digit indicates a structural portion within a circuit element. The final letter indicates a structural subportion.

GENERAL SIGNAL PROCESSING SYSTEM (FIG. 1)

Signal processing system 100 (see FIG. 1) receives photons from an application device 106 which are converted to low level current signals $i_{in}$ by photo detector 110. System 100 provides a decoded digital output to data processing system 112; and may be used in optical data applications such as fiber optic communications or optical scanners as shown in the embodiment of FIG. 1. Scanners scan coded material with a radiation beam, collect and image the backscatter. Detector 110 is positioned behind the scanner at the image focal point of the scanner backscatter collection lens.

Preamplifier 120 amplifies the low level analog signals $i_{in}$ from detector 110, sacrificing bandwidth to minimize injected noise. One or more bandwidth compensation circuits 130:A, 130:B, or 130:C may be employed to recapture the bandwidth lost in the preamplifier while maintaining a high signal-to-noise ratio. Filter 140 incorporates the compensation circuit characteristics to define the bandwidth of system 100.

Digitizer 150 digitizes the leading and trailing edges of the analog backscatter signal corresponding to step contrast changes at the edges of the bar coded material. Digitization is a saturation process requiring non-linear circuit element. Decoder 152 qualifies the data in the digitized backscatter signal recreating the alphanumerics data coded within the bar code. Microprocessor 154 is incorporated into the decoder and coordinates the blocks in system 100. Interface 156 presents the decoded binary data to data processing system 112.

LINEARITY IN SYSTEM 100

Analog front-end section 100:F is formed by detector 110, preamplifier 120, compensation circuit 130 and filter 140. The linearity of the front-end sector significantly affects the back scatter processing performance of system 100. The front-end elements process the backscatter signal while the signal is still in the analog pulse form. Amplitude and phase linearity within these elements maintains the waveshape of the backscatter signal pulses and preserves zero crossing timing in each leading and trailing edges. Compensation circuit 130 may be employed before the filter or after the filter, or within the filter as shown in FIG. 1.

OPERATIONAL AMPLIFIER 122

Operational amplifier 122 within preamplifier 120 functions in the transimpedance mode due to negative feedback impedance "$R_a$" connecting amplifier output node 122:O to amplifier input node 122:I. The small signal current "$i_{in}$" from photodetector 110 at the input node is converted to a voltage signal "$e_o$" at the output node. Feedback impedance $R_a$ operates to maintain the input node at near zero potential and determines the transimpedance transfer function of the amplifier:

Transimpedance $= R_a = e_o/i_{in}$.

High values of $R_a$ enhance the signal-to-noise performance of system front-end 100:F. However, its is preferred that $R_a$ not exceed linearity limits and saturate amplifier 122.

Figure 2A:
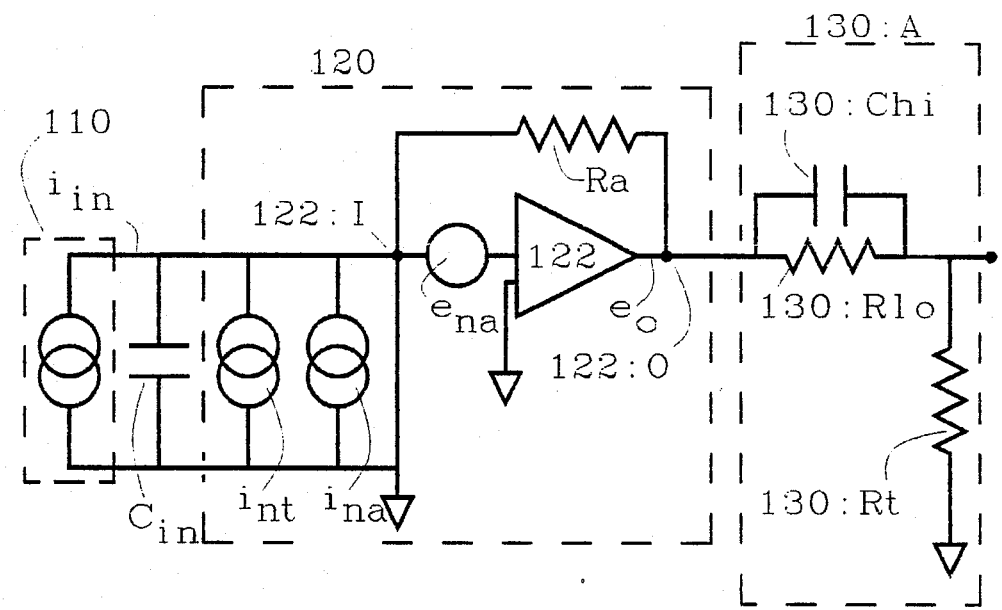
FIG. 2A is a circuit diagram of a single pole operational amplifier including internal noise sources and a compensation circuit showing for use in the scanner of FIG. 1.
Figure 2B:
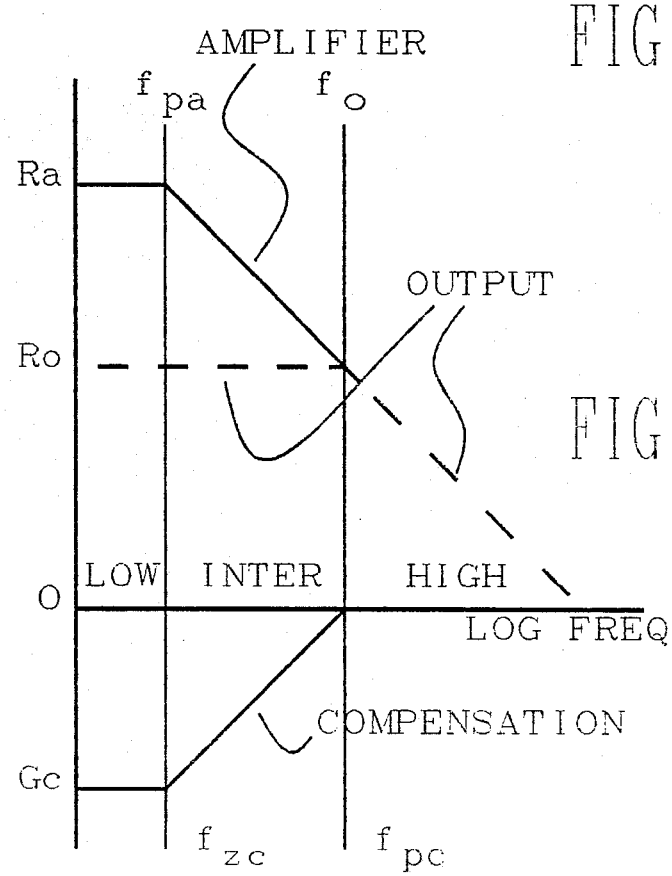
FIG. 2B is a Bode plot for the single pole amplifier and compensation circuit of FIG. 2A.

SINGLE POLE EMBODIMENT (FIGS. 2A and 2B)

An ideal single pole embodiment of preamplifier 120 and compensation circuit 130 is shown in FIG. 2A. Related noise sources are shown as noise equivalent circuits. The three primary noise sources associated with transimpedance operational amplifiers are:

$i_{na}$ the amplifier current noise;
$e_{na}$ the amplifier voltage noise and and
$i_{nt}$ the thermal noise of feedback resistor $R_a$ $$i_{nt} = \sqrt{4kTf_o/R_a} \ ;$$

where:
k is Boltzman's constant,
T is the temperature in degrees Kelvin, and
$f_o$ is the system noise bandwidth at output 132:O.

These noise sources are random and combine in a root-sum-square fashion at summing input node 122:I to yield an equivalent noise current of:

$$i_{neq} = \sqrt{(i_{na})^2 + (e_{na}/R_a)^2 + 4kTf_o/R_a}$$

High values of $R_a$ lower the equivalent noise current of the operational amplifier by reducing the amplifier voltage noise factor $e_{na}$ and reducing the thermal factor $4kf_o$. Therefore increasing $R_a$ by a multiplier M decreases the equivalent noise current $i_{neq}$. If thermal noise $i_{nt}$ is the dominant factor, the noise is reduced by 1/M. If amplifier voltage noise $i_{na}$ is the dominant factor, the noise is reduced by $(1/M)^{\frac{1}{2}}$.

High values of $R_a$ increase the transimpedance transfer function due to the negative feedback, and also lowers the bandwidth due to the total capacitance at input node 122:I to the amplifier. The upper bandwidth frequency (3 db pole point) in a single pole amplifier is:

$f_{pa} = \frac{1}{2}\pi R_a C_{in}$;

where:

$f_{pa}$ is the pre-amplifier bandwidth (pole frequency see FIG. 2B),
$R_a$ is the feedback resistor,
$C_{in}$ is the total capacitance at input node 122:I and equals the sum of the detector capacitance the amplifier capacitance, and the stray capacitances.

Increasing $R_a$ *by a multiplier of M reduces the noise current, but also decreases the amplifier bandwidth* $f_{pa}$ by a factor of 1/M.

COMPENSATION CIRCUIT 130:A (FIG. 2A)

The bandwidth lost in operational amplifier 122 is recaptured by compensation circuit 130:A connected between output node 122:O and filter 140. The compensation circuit has a voltage dividing resistor network which attenuates the low frequency domain but not high frequency domain. Low frequencies appearing at output node 122:O pass through low frequency attenuation resistor 130:Rlo and then through a termination resistor 130:Rt. The point between the resistors forms output node 132:O.

The amplitude of the low frequency domain of $e_o$ developed at the filter input node is attenuated by the compensation ratio $R_c$:

Low Freq Domain Amplitude = $e_o/G_c$ where:
$G_c = (130:Rt)/(130:Rt + 130:Rlo)$
where:
130:Rlo is the attenuation resistor,
130:Rt is the termination resistor.

A high frequency bypass capacitor 130:Chi is connected in parallel with attenuation resistor 130:Rlo. The high frequency domain of $e_o$ appearing at output node 122:O passes through to filter input node 142:I without attenuation. Compensation circuit 130 enhances the high frequency content of $e_o$ and attenuates the low frequency content.

The bandwidth frequency (3 db zero point) of the RC compensation circuit is:

$f_{zc} = \frac{1}{2}\pi(130:Rlo)(130:Chi)$;

where:
$f_{zc}$ is the compensation bandwidth (zero break frequency),
130:Rlo is the attenuation resistor,
130:Chi is the bypass capacitor.

Preferably, $f_{zc} = f_{pa}$ in order promote phase linearity of the analog signal. The compensation circuit zero at $f_{zc}$ cancels the amplifier pole at $f_{pa}$ and minimizes phase distortion when combined with filter 140.

BODE PLOT (FIG. 2B)

The effect of amplifier 122 and compensation circuit 130:A on the bandwidth $f_o$ at output 130:O is shown graphically by the Bode plot (log of transimpedance against log of frequency) shown in FIG. 2B. The curve labeled OUTPUT (in dashed lines) is the compensated output appearing at output 130:O. The OUTPUT curve has an enhanced bandwidth $f_o$ because of the low compensated or effective transimpedance $R_o$. The effective transimpedance $R_o$ has a low effective thermal noise level which enhances the signal-to-noise level at output 130:O. The curve labeled AMPLIFIER is the uncompensated $e_o$ appearing at operational amplifier output 122:O; and has a transimpedance of $R_a$ *and pole at* $f_{pa}$. The curve labeled COMPENSATION is the compensation effect of compensation circuit 130:A, with a low frequency attenuation of $G_{zc}$ and a zero at $f_{zc}$. In order to enhance phase linearity, $f_{pa} = f_{zc}$ and $f_{pc}$ is at the bandwidth frequency $f_o$. The compensation ratio $G_c$ determines the location of $f_{zc}$ on the frequency axis to permit coincidence of compensation network pole at the enhanced bandwidth.

The low frequency domain includes all frequencies below $f_{pa}$. The high frequency domain includes all frequencies above $f_{pc}$. An intermediate frequency domain between the low domain and the high domain includes all frequencies greater than $f_{zc}$ but less than $f_{pc}$.

DOUBLE POLE EMBODIMENT (FIGS. 3)

In practice, amplifiers tend to be multi-polar, and require more than one zero compensation circuit to maintain phase linearity. The two compensation circuits 330:A and 330:C shown in the embodiment of FIG. 3 may be employed to offset a double poled amplifier. The compensation shown is the RC network type with an attenuation resistor and bypass capacitor. Other compensation circuits may be employed including active circuits.

SPECIFIC EMBODIMENT

The following particulars of the single pole embodiment shown in FIG. 2 are given as an illustrative example of a noise reduction amplifier with bandwidth enhancement.

Photodetector 110 is a SFH202 current source PIN photodiode made by Siemens.

Operational amplifier 122 is an LF357 from National Semiconductor for maintaining the input node 122:I at zero and establishing a low output impedance at output node 122:O.

Feedback impedance $R_a$ for amplifier 122 is a 134.3K resistor for defining the transimpedance transfer function of amplifier 122.

Low frequency attenuation resistor 130:Rlo is an 1800 ohm resistor.

High frequency bypass capacitor 130:Chi connected across resistor 130:Rlo is a 1,000 picofarad capacitor.

Termination resistor 130:Rt is a 150 ohm resistor for accommodating an input into filter 140.

The total capacitance $C_{in}$ at input node 122:I is about seven picofarads.

The pole and zero frequencies are $f_{pa}=f_{zc}=170$ kilohertz, and $f_o=1$ megahertz.

The values and components given above are not intended as defining the limitations of the invention. Numerous other applications and configurations are possible.

INDUSTRIAL APPLICABILITY

It will be apparent to those skilled in the art that the objects of this invention have been achieved as described hereinbefore.

Clearly various changes may be made in the structure and embodiments shown herein without departing from the concept of the invention. Further, features of the embodiments shown in the various Figures may be employed with the embodiments of the other Figures.

Therefore, the scope of the invention is to be determined by the terminology of the following claims and the legal equivalents thereof.

I claim as my invention:

1. A transimpedance device having an effective feedback impedance and responsive to an input photon signal for providing an output voltage signal with an enhanced signal-to-noise ratio and a predetermined frequency bandwidth, comprising:

capacitive current source means responsive to the input photon signal for providing an analog current signal;

an operational amplifier means having an input node with a predetermined capacitance to reference potential responsive to the analog current signal, and having an output node;

feedback impedance means connected in negative feedback relationship with the operational amplifier means from the output node to the input node thereof, the feedback impedance means having a predetermined impedance substantially greater than the effective feedback impedance of the transimpedance device for reducing the thermal noise current of the feedback impedance means to increase the signal-to-noise ratio of the operational amplifier means, the predetermined impedance of the feedback impedance means and the predetermined capacitance of the input node determining the upper 3 db pole frequency $f_{pa}$ on the Bode plot of the operational amplifier means at a frequency substantially less than the predetermined bandwidth of the transimpedance device; and frequency compensation means responsive to the signal at the output node of the operational amplifier means for defining the upper 3 db pole frequency $f_{pc}$ in the Bode plot of the output signal of the transimpedance device which is substantially greater than the pole frequency $f_{pa}$ of the operational amplifier for reestablishing the predetermined bandwidth and reducing the signal-to-noise ratio of the output signal of the transimpedance device;

whereby the output signal of the transimpedance device maintains the predetermined bandwidth with a net increase in signal-to-noise.

2. The transimpedance device of claim 1, in which the frequency compensation means is connected to the output node of the operational amplifier means.

3. The transimpedance device of claim 1, wherein the frequency compensation means is an R-C network.

4. The transimpedance device of claim 3, wherein the R-C network has a zero frequency $f_{zc}$ in a Bode plot thereof defining a low frequency domain of frequencies less than the zero frequency $f_{zc}$.

5. The transimpedance device of claim 4, wherein the pole frequency $f_{pc}$ in the Bode plot of the R-C network defines a high frequency domain of frequencies greater than the pole frequency $f_{pc}$ and an intermediate frequency domain of frequencies less than the pole frequency $f_{pc}$ but greater the zero frequency $f_{zc}$.

6. The transimpedance device of claim 5, wherein the R-C network comprises:

attenuating resistance means for attenuating the low frequency domain of the signal at the output node of the operational amplifier means, the attenuating resistor means having an input side and an output side; and bypass capacitance means connected from the input side to the output side of the attenuating resistance means for bypassing the high frequency domain of the signal at the output node of the operational amplifier means.

7. The transimpedance device of claim 6, wherein the R-C network further comprises a termination resistance means connected between the output side of the attenuating resistance means and the reference potential.

8. The transimpedance device of claim 5, wherein the pole frequency $f_{pa}$ is equal to the zero frequency $f_{zc}$ for cancelling the pole of the operational amplifier means and zero of the frequency compensation means to enhance the phase linearity of the output signal of the transimpedance device.

9. The transimpedance device of claim 8, wherein the pole frequency $f_{pc}$ is equal to the predetermined bandwidth of the transimpedance device.

10. The transimpedance device of claim 1, wherein the operational amplifier means is an operational amplifier in the linear mode of operation.

11. The transimpedance device of claim 10, wherein the feedback impedance means is a resistor.

12. The transimpedance device of claim 11, wherein the feedback resistor is connected to the inverting input of the operational amplifier.

13. The transimpedance device of claim 10, wherein the transimpedance device is amplitude linear.

14. The transimpedance device of claim 13, wherein the transimpedance device is phase linear.

15. An analog signal processing device responsive to back-scatter from coded material scanned by a radiation beam for providing an output signal, having a predetermined frequency bandwidth comprising:
   photodetector means responsive to the backscatter for providing an analog current signal;
   transimpedance operational amplifier means having an input node for receiving the analog current signal and having an output node;
   feedback impedance means connected between the input node and the output node of the operational amplifier means for determining the upper 3 db pole frequency $f_{pa}$ in the Bode plot of the operational amplifier means which is substantially less than the predetermined bandwidth of the signal processing device, and for reducing the signal-to-noise ratio of the operational amplifier means;
   frequency compensation means responsive to the signal at the output node of the operational amplifier means for restoring the predetermined frequency bandwidth of the signal processing device; and
   filter means for cooperating with the frequency compensation means to define the predetermined bandwidth of the signal processing device; and
   digitizer means within the digital back end section responsive to the analog front end section for converting the filtered signal from the analog front end into a digital signal; and
   decoder means within the digital back end section responsive to the digitizer means for decoding the digitized signal.

16. The signal processing device of claim 15, wherein the frequency compensation means is connected to the output node of the operational amplifier means.

17. The signal processing device of claim 15, wherein the filter means is connected to the output node of the operational amplifier means and the frequency compensation means is connected within the filter means.

18. The signal processing device of claim 15, wherein the filter means is connected to the output node of the operational amplifier means and the frequency compensation means is connected to the output of the filter means.

19. The signal processing device of claim 18, wherein the signal processing system is amplitude and phase linear.

20. The signal processing device of claim 15, wherein the frequency compensation means is a plurality of R-C networks.

21. The signal processing device of claim 15, wherein the frequency compensation means is an R-C network.

22. The signal processing device of claim 21, wherein the R-C network has a zero frequency $f_{zc}$ in a Bode plot thereof at the same frequency as pole frequency $f_{pa}$ for cancelling the pole and enhance the phase linearity of the output of the signal processing device.

23. The signal processing device of claim 22, wherein the R-C network has a pole frequency $f_{pc}$ for defining the bandwidth of the signal processing device.

24. The signal processing device of claim 23, wherein the R-C network pole at frequency $f_{pc}$ functions as a filter pole in the filter means.

25. The signal processing device of claim 23, wherein the R-C network zero frequency $f_{zc}$ defines a low frequency domain of frequencies less than zero frequency $f_{zc}$, and the R-C network pole frequency $f_{pc}$ defines a high frequency domain of frequencies greater than pole frequency $f_{pc}$ and an intermediate frequency domain of frequencies between zero frequency $f_{zc}$ and pole frequency $f_{pc}$.

26. The signal processing device of claim 25, wherein the R-C network comprises:
   attenuating resistance means for attenuating the low frequency domain of the signal at the output node of the operational amplifier means, the attenuating resistor means having an input side and an output side; and
   bypass capacitance means connected from the input side to the output side of the attenuating resistance means for bypassing the high frequency domain of the signal at the output node of the operational amplifier means.

27. The signal processing device of claim 15, wherein the operational amplifier means operates in the linear mode.

28. The signal processing device of claim 27, wherein the photodetector means is linear.

29. The signal processing device of claim 28, wherein the frequency compensation means is linear.

30. The signal processing device of claim 27, wherein the signal processing device is amplitude linear.

31. The signal processing device of claim 27, wherein the signal processing device is phase linear.

* * * * *